(12) United States Patent
Hou

(10) Patent No.: US 10,344,374 B2
(45) Date of Patent: Jul. 9, 2019

(54) MECHANICAL CHUCK AND PLASMA MACHINING DEVICE

(71) Applicant: BEIJING NAURA MICROELECTRONICS EQUIPMENT CO., LTD., Beijing (CN)

(72) Inventor: Jue Hou, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 152 days.

(21) Appl. No.: 15/118,566

(22) PCT Filed: Dec. 31, 2014

(86) PCT No.: PCT/CN2014/095759
§ 371 (c)(1),
(2) Date: Aug. 12, 2016

(87) PCT Pub. No.: WO2015/127819
PCT Pub. Date: Sep. 3, 2015

(65) Prior Publication Data
US 2017/0044660 A1    Feb. 16, 2017

(30) Foreign Application Priority Data
Feb. 28, 2014 (CN) .......................... 2014 1 0072321

(51) Int. Cl.
*H01J 37/20* (2006.01)
*C23C 14/50* (2006.01)
(Continued)

(52) U.S. Cl.
CPC ........ *C23C 14/505* (2013.01); *C23C 16/4585* (2013.01); *H01J 37/20* (2013.01); *H01J 37/32715* (2013.01); *H01L 21/68721* (2013.01)

(58) Field of Classification Search
CPC .............. H01J 37/3411; H01J 37/3441; H01J 37/3447; H01J 37/20; H01J 37/32715
(Continued)

(56) References Cited

U.S. PATENT DOCUMENTS 5,513,594 A * 5/1996 McClanahan ..... H01L 21/68728
                                                    118/503
5,632,873 A * 5/1997 Stevens .................. C23C 14/50
                                                    118/503
(Continued)

FOREIGN PATENT DOCUMENTS

CN          101083223 A      12/2007

OTHER PUBLICATIONS

PCT/CN2014/095759 International Search Report dated Apr. 3, 2015; 2 pgs.

*Primary Examiner* — Rodney G McDonald
(74) *Attorney, Agent, or Firm* — Anova Law Group, PLLC

(57) ABSTRACT

Embodiments of the invention provide a mechanical chuck and a plasma processing apparatus. According to at least one embodiment, the mechanical chuck includes a base and a fixing assembly including a locking ring, an insulation ring and a spacer ring, wherein the locking ring is configured to press an edge region of the workpiece to be processed so as to fix the same onto the base; an orthogonal projection of the spacer ring on an upper surface of the locking ring overlaps with the upper surface of the locking ring; and the insulation ring electrically insulates the spacer ring from the locking ring, an inner circumferential wall of the insulation ring, a
(Continued)

portion of the upper surface of the locking ring inside the inner circumferential wall and a portion of a lower surface of the spacer ring inside the inner circumferential wall form a first groove, and an outer circumferential wall of the insulation ring, a portion of the upper surface of the locking ring outside the outer circumferential wall and a portion of the lower surface of the spacer ring outside the outer circumferential wall form a second groove.

9 Claims, 3 Drawing Sheets

(51) Int. Cl.
*C23C 16/458* (2006.01)
*H01L 21/687* (2006.01)
*H01J 37/32* (2006.01)

(58) Field of Classification Search
USPC ....... 204/298.15, 298.11; 118/503; 165/80.1; 156/345.3
See application file for complete search history.

(56) References Cited

U.S. PATENT DOCUMENTS

| | | | |
|---|---|---|---|
| 5,804,042 A | | 9/1998 | Ferreira et al. |
| 5,922,133 A | * | 7/1999 | Tepman ............... C23C 14/50 |
| | | | 118/503 |
| 6,238,513 B1 | | 5/2001 | Arnold et al. |
| 7,708,860 B2 | | 5/2010 | Arita et al. |
| 2001/0001437 A1 | | 5/2001 | Mikami et al. |
| 2002/0179246 A1 | * | 12/2002 | Garabedian ....... H01J 37/32623 |
| | | | 156/345.3 |
| 2007/0221363 A1 | * | 9/2007 | Akaike ............. H01L 21/67103 |
| | | | 165/80.1 |
| 2011/0278165 A1 | * | 11/2011 | Rasheed ................ C23C 14/35 |
| | | | 204/298.11 |

* cited by examiner

MECHANICAL CHUCK AND PLASMA MACHINING DEVICE

CROSS REFERENCE TO RELATED APPLICATIONS

This application claims the benefit of and priority to PCT/CN2014/095759, filed on Dec. 31, 2014, entitled (translation), "MECHANICAL CHUCK AND PLASMA MACHINING DEVICE," which claims the benefit of and priority to Chinese Patent Application No. 201410072321.2, filed on Feb. 28, 2014, all of which are hereby incorporated by reference in their entirety into this application.

BACKGROUND

Field of the Invention

Embodiments of the invention relate to the field of microelectronic processing technology, and specifically relate to a mechanical chuck and a plasma processing apparatus.

Description of the Related Art

In the process of manufacturing an integrated circuit, physical vapor deposition (hereinafter referred to as "PVD") technique is usually used to deposit a material layer, such as a metal layer or the like, on a wafer. As through silicon via (hereinafter referred to as "TSV") technique has been widely used, the PVD technique is mainly applied for depositing a barrier layer and a copper seed layer inside a through silicon via.

At present, an electrostatic chuck is commonly used to fix the wafer in the PVD technique. However, in the deposition process for a through silicon via, the electrostatic chuck cannot electrostatically adsorb the wafer due to large thickness and high stress of the film deposited in the through silicon via; in addition, in a subsequent packaging process, the thickness of the wafer is reduced and a glass substrate is adhered to the bottom of the wafer, so the electrostatic chuck cannot electrostatically adsorb the wafer having the glass substrate. In this case, a mechanical chuck is required to fix the wafer instead of the electrostatic chuck.

FIG. 1 is a cross-sectional view of a conventional PVD apparatus. As illustrated in FIG. 1, the PVD apparatus includes a reaction chamber 10, and a target material 14 is provided at the top inside the reaction chamber 10 and is electrically connected to a direct current (DC) power supply (not shown in the drawings). A mechanical chuck is provided below the target material 14 inside the reaction chamber 10, and includes a base 11 and a locking ring 13, wherein the base 11 is used for carrying a wafer 12 and is electrically connected to a radio frequency (RF) power supply 15, and the locking ring 13 is used for pressing an edge region of the wafer 12 disposed on the base 11 during the process so as to fix the wafer 12 onto the base 11. During the PVD process, a negative bias voltage is applied to the target material 14 by the DC power supply to excite a process gas in the reaction chamber 10 to form plasma, and attract energetic particles in the plasma to bombard the target material 14, so as to allow metal atoms on a surface of the target material 14 to escape and be deposited on the wafer 12. At the same time, RF power is applied to the base 11 by the RF power supply 15 to form a negative bias voltage on an upper surface of the wafer 12, which can attract the sputtered metal atoms to be deposited into the through silicon via, thereby filling the through silicon via.

In practice, the degree to which the plasma is controlled by the negative bias voltage is generally measured by resputter rate, which refers to a ratio (usually larger than one) of the average thin-film resistance under RF power to the average thin-film resistance without RF power, and a larger ratio means that the plasma can bombard the surface of the wafer more vertically, thus, a through silicon having a relatively large depth-to-width ratio (larger than 6:1) can be filled.

It was found in experiments that, when a RF power of 600W is applied to a mechanical chuck and an electrostatic chuck, respectively, the resputter rate of the electrostatic chuck is 1.18 while the resputter rate of the mechanical chuck is only 0.88. This situation results from the fact that the value of the negative bias voltage depends on the size of a capacitor area under the condition of same process duration and same RF power, that is, the smaller the capacitor area, the larger the negative bias voltage, and otherwise the negative bias voltage is smaller. The capacitor is formed between one or more elements electrically connected to the RF power supply and the ground with plasma accommodated therebetween, and the term "capacitor area" refers to a total area of a surface of the one or more elements exposed in the plasma. For an electrostatic chuck, the capacitor area thereof is an area of the upper surface of the wafer. For a mechanical chuck, for the purpose of avoiding sparking at the time of applying a RF power to the base 11 by the RF power supply 15, the base 11, the wafer 12 and the locking ring 13 are required to be electrically connected with each other to allow the three to at a same voltage level, which makes that the RF voltage is applied to each of the base 11, the wafer 12 and the locking ring 13, so the capacitor area of the mechanical chuck is the sum of the areas of upper surfaces of the wafer 12 and the locking ring 13.

Since the area of the upper surface of the locking ring 13 is comparable with that of the wafer 12 (taking a 300-mm PVD apparatus for example, the area of the upper surface of the wafer 12 is 0.071 m² and the area of the upper surface of the locking ring 13 is 0.055 m²), the negative bias voltage formed on the upper surface of the wafer 12 is reduced due to the nearly doubled capacitor area of the mechanical chuck compared to that of the electrostatic chuck, thereby reducing resputter rate. Although the negative bias voltage can be increased by increasing RF power, the increase of RF power will result in not only an increasing cost for use but also a rising temperature of the reaction chamber 10 and the wafer 12, thereby adversely affecting lifetime of the reaction chamber 10 and process quality.

SUMMARY

Embodiments of the invention are intended to solve at least one of the technical problems existing in the conventional art, and provide a mechanical chuck and a plasma processing apparatus, which can increase a negative bias voltage formed on an upper surface of a workpiece to be processed without increasing RF power, thereby improving resputter rate.

According to at least one embodiment, there is provided a mechanical chuck, which includes a base for carrying a workpiece to be processed and a fixing assembly, the fixing assembly including a locking ring, an insulation ring and a spacer ring sequentially stacked from bottom to top, wherein the locking ring is used for pressing an edge region of the workpiece disposed on the base during a process so as to fix it onto the base; an orthogonal projection of the spacer ring on an upper surface of the locking ring overlaps with the upper surface of the locking ring; the insulation ring is used to electrically insulate the locking ring from the spacer ring, an inner circumferential wall of the insulation ring, a portion of the upper surface of the locking ring inside the inner circumferential wall and a portion of a lower surface of the spacer ring inside the inner circumferential wall together form a first groove, and an outer circumferential wall of the insulation ring, a portion of the upper surface of the locking ring outside the outer circumferential wall and a portion of the lower surface of the spacer ring outside the outer circumferential wall together form a second groove, so as to prevent plasma from being deposited onto a surface of the insulation ring.

According to at least one embodiment, the first groove has a depth-to-width ratio larger than 7:1, and the second groove has a depth-to-width ratio larger than 7:1.

According to at least one embodiment, the first groove and the second groove each have a width smaller than 3 mm.

According to at least one embodiment, the sum of heights of the insulation ring and the spacer ring in a direction perpendicular to the upper surface of the locking ring is no larger than 8 mm.

According to at least one embodiment, a material of the insulation ring includes ceramic or quartz.

According to at least one embodiment, the insulation ring is formed by plating an insulation material onto the upper surface of the locking ring.

According to at least one embodiment, a material of the spacer ring includes a metal or an insulation material.

According to at least one embodiment, the fixing assembly further includes an insulation screw used for fixing the locking ring, the insulation ring and the spacer ring together.

According to another embodiment, there is provided a plasma processing apparatus, including a reaction chamber, in which a mechanical chuck is provided to carry a workpiece to be processed, the mechanical chuck being a mechanical chuck provided by any of the above embodiments of the invention.

BRIEF DESCRIPTION OF THE DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

Advantages and features of the invention and methods of accomplishing the same will be apparent by referring to embodiments described below in detail in connection with the accompanying drawings. However, the invention is not limited to the embodiments disclosed below and may be implemented in various different forms. The embodiments are provided only for completing the disclosure of the invention and for fully representing the scope of the invention to those skilled in the art.

Figure 1:
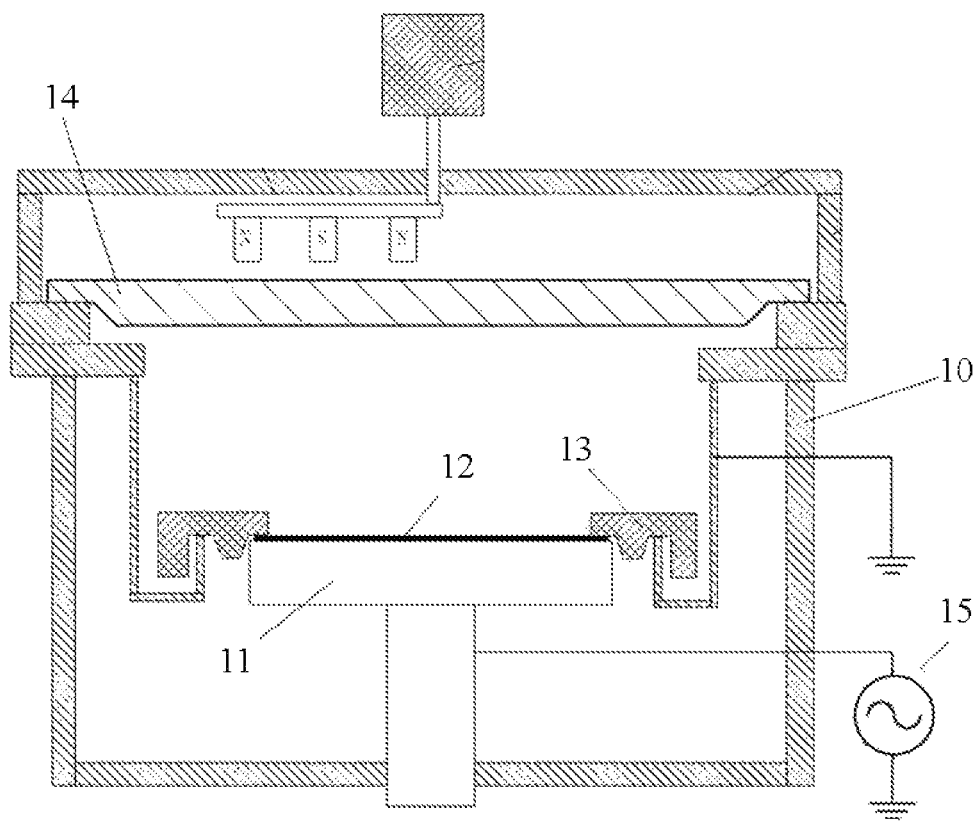
FIG. 1 is a cross-sectional view of a conventional PVD apparatus.
Figure 2A:
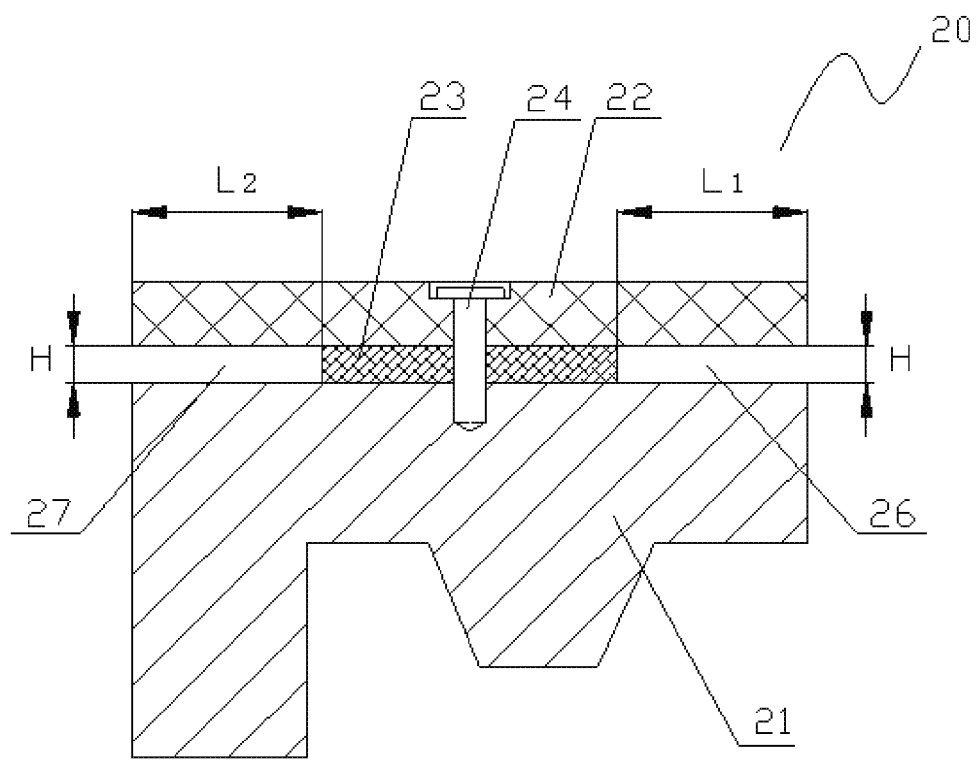
FIG. 2A is a partial cross-sectional view of a fixing assembly of a mechanical chuck according to an embodiment of the invention.
Figure 2B:
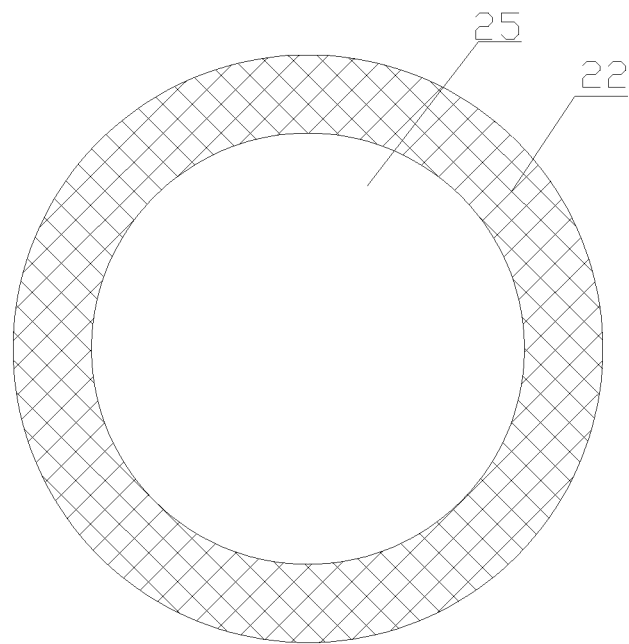
FIG. 2B is a top view of a fixing assembly of a mechanical chuck according to an embodiment of the invention.

FIG. 2A is a partial cross-sectional view of a fixing assembly of a mechanical chuck according to an embodiment of the invention. FIG. 2B is a top view of the fixing assembly of the mechanical chuck according to an embodiment of the invention. Referring to FIGS. 2A and 2B, the mechanical chuck includes a base (not shown in the drawings) for carrying a workpiece 25 to be processed, and a fixing assembly 20. The fixing assembly 20 has a multilayer structure, and specifically includes a locking ring 21, an insulation ring 23 and an spacer ring 22 sequentially stacked from bottom to top, wherein the locking ring 21 is used for pressing an edge region of the workpiece 25 disposed on the base during a process so as to fix it onto the base, as illustrated in FIG. 2B; the spacer ring 22 may be made of metal, insulation material or the like and an orthogonal projection thereof on an upper surface of the locking ring 21 overlaps with the upper surface of the locking ring 21; and the insulation ring 23 is used for electrically insulating the spacer ring 22 from the locking ring 21, and is made of a material including ceramic or quartz. In practice, the insulation ring 23 may be an insulation layer provided on the upper surface of the locking ring 21. For example, the insulation ring 23 may be formed by plating an insulation material onto the upper surface of the locking ring 21.

In addition, the fixing assembly 20 further includes an insulation screw 24 used for fixing the locking ring 21, the insulation ring 23 and the spacer ring 22 together.

Since the insulation ring 23 electrically insulates the spacer ring 22 from the locking ring 21, the voltage of spacer ring 22 is floating, that is, when RF power supply supplies RF power to the base to form a negative bias voltage on the upper surface of the workpiece 25, the RF voltage is not applied to the spacer ring 22, and since the orthogonal projection of the spacer ring 22 on the upper surface of the locking ring 21 overlaps with the upper surface of the locking ring 21, the entire upper surface (as shown in FIG. 2B) of the locking ring 21 does not contribute to the capacitor area due to the shielding of the spacer ring 22, that is, the capacitor area of the mechanical chuck provided by the embodiment shrinks to the area of the upper surface of the workpiece 25, so the negative bias voltage formed on the upper surface of the workpiece 25 can be increased without increasing RF power, thereby improving resputter rate.

In addition, an inner circumferential wall of the insulation ring 23, a portion of the upper surface of the locking ring 21 inside the inner circumferential wall and a portion of a lower surface of the spacer ring 22 inside the inner circumferential wall form a first groove 26 together, and an outer circumferential wall of the insulation ring 23, a portion of the upper surface of the locking ring outside the outer circumferential wall and a portion of the lower surface of the spacer ring 22 outside the outer circumferential wall form a second groove 27 together. In other words, in a radial direction of the locking ring 21, the insulation ring 23 has a length smaller than that of the locking ring 21 and is provided at a position close to the middle between the locking ring 21 and the spacer ring 22. The inner circumferential wall of the locking ring 21 and the inner circumferential wall of the spacer ring 22 are substantially aligned in a vertical direction, and the outer circumferential wall of the locking ring 21 and the outer circumferential wall of the spacer ring 22 are substantially aligned in the vertical direction, so that the inner and outer circumferential walls of the insulation ring 23 are inwardly recessed relative to the inner circumferential walls of the locking ring 21 and the spacer ring 22 and the outer circumferential walls of the locking ring 21 and the spacer ring 22, respectively, to form ring-shaped deep grooves (i.e., the second groove 27 and the first groove 26). With the first groove 26 and the second groove 27, plasma can be prevented from being deposited onto the surface of the insulation ring 23, and thus electrical connection between the spacer ring 22 and the locking ring 21 due to the deposition of metal onto the insulation ring 23 can be avoided, thereby allowing the spacer ring 22 and the locking ring 21 to be electrically insulated from each other throughout the process.

It can be easily understood that the larger the ratios of the depth L1 of the first groove 26 to the width H thereof and the depth L2 of the second groove 27 to the width H thereof, the less the probability of depositing the metal onto the insulation ring 23, and preferably, a ratio of the depth L1 of the first groove 26 to the width H thereof is larger than 7:1, and a ratio of the depth L2 of the second groove 27 to the width H thereof is larger than 7:1.

Furthermore, since the plasma formed by exciting the process gas is easily deposited onto the insulation ring 23 during the diffusion, further, the widths H (the smaller the widths H, the less the probability of depositing the metal onto the insulation ring 23) of the first groove 26 and the second groove 27 need to be adjusted according to the mean free path of the plasma. Preferably, each of the widths of the first groove 26 and the second groove 27 is smaller than 3 mm, which may be suitable for the case where the mean free path of the plasma is around 3.3 mm.

It should be noted that, in practice, the sum of the heights of the insulation ring 23 and the spacer ring 22 in a direction perpendicular to the upper surface of the locking ring 21 should be no larger than 8 mm, so as to avoid that plasma fails to reach the edge region of the upper surface of the workpiece 25 due to the shadow effect of the insulation ring 23 and the spacer ring 22 to adversely affect uniformity of the process.

Figure 3:
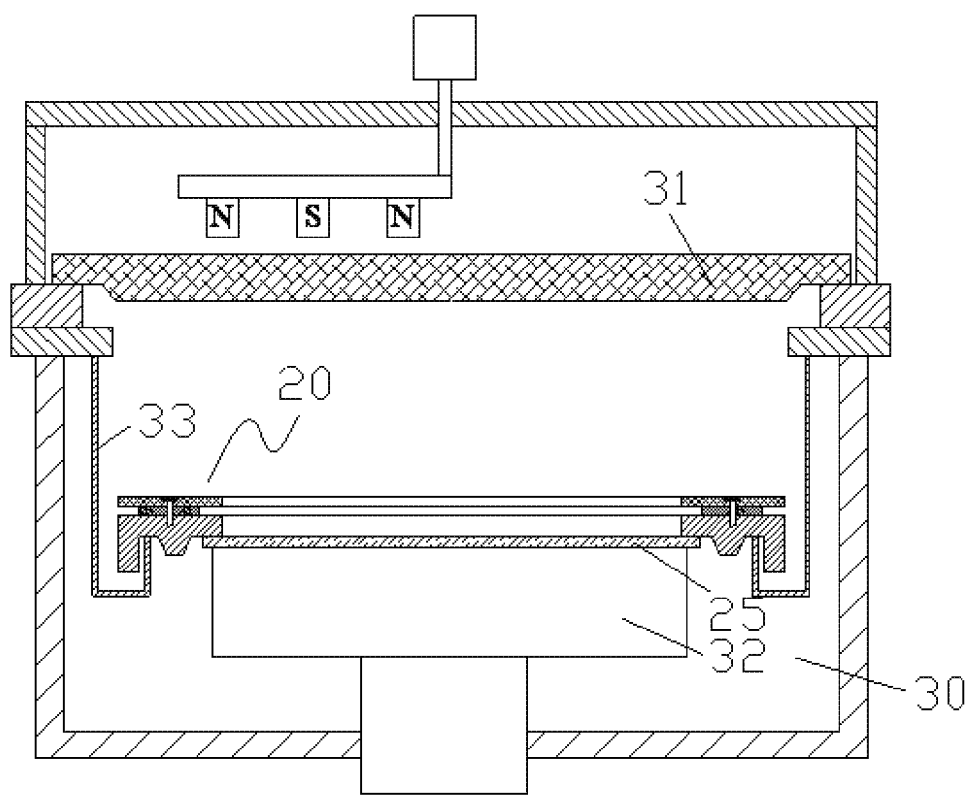
FIG. 3 is a cross-sectional view of a plasma processing apparatus according to an embodiment of the invention.

As another technical solution, FIG. 3 is a cross-sectional view of a plasma processing apparatus provided by an embodiment of the present invention. Referring to FIG. 3, the present invention further provides a plasma processing apparatus, which includes a reaction chamber 30, and a target material 31 is provided at the top inside the reaction chamber 30 and is electrically connected to a DC power supply (not shown in the drawings). A mechanical chuck is provided below the target material 31 inside the reaction chamber 30, and includes a base 32 and a fixing assembly 20, wherein the base 32 is used for carrying a workpiece 25 to be processed and is electrically connected to a RF power supply (not shown in the drawings), and the fixing assembly 20 is the fixing assembly provided by the embodiments of the present invention and is used for fixing the workpiece 25 onto the base 32. During a PVD process, a negative bias voltage is applied to the target material 31 by the DC power supply to excite a process gas in the reaction chamber to form plasma, and attract energetic particles in the plasma to bombard the target material 31, so as to allow metal atoms on a surface of the target material 31 to escape and to be deposited on the workpiece 25. At the same time, RF power is applied to the base 31 by the RF power supply to form a negative bias voltage on an upper surface of the workpiece 25, which can attract the sputtered metal atoms to be deposited into the through silicon via, thereby filling the through silicon via.

In the plasma processing apparatus provided by the embodiment of the present invention, by employing the above mechanical chuck provided by the embodiments of the present invention, the negative bias voltage formed on the upper surface of the workpiece to be processed can be increased without increasing RF power, thereby improving resputter rate.

Embodiments of the invention provide non-obvious advantages over the conventional art. For example, the mechanical chuck according to embodiments of the invention fixes the workpiece to be processed on the base by means of the fixing assembly, which has a multilayer structure and specifically includes a locking ring, an insulation ring and an spacer ring sequentially stacked from bottom to top, wherein the locking ring is used for pressing an edge region of the workpiece disposed on the base during the process so as to fix the workpiece onto the base; an orthogonal projection of the spacer ring on an upper surface of the locking ring overlaps with the upper surface of the locking ring; and the insulation ring is used for electrically insulating the spacer ring from the locking ring. Since the insulation ring electrically insulates the spacer ring from the locking ring, the voltage of spacer ring is floating, that is, when RF power is applied to the base by the RF power supply to form a negative bias voltage on the upper surface of the workpiece, the RF voltage is not applied to the spacer ring, and since the orthogonal projection of the spacer ring on the upper surface of the locking ring overlaps with the upper surface of the locking ring, the entire upper surface of the locking ring does not contribute to the capacitor area due to the shielding of the spacer ring, that is, the capacitor area of the mechanical chuck is only the area of the upper surface of the workpiece, so the negative bias voltage formed on the upper surface of the workpiece can be increased without increasing RF power, thereby improving resputter rate.

In addition, by means of the first groove, which is formed by the inner circumferential wall of the insulation ring, the portion of the upper surface of the locking ring inside the inner circumferential wall and the portion of a lower surface of the spacer ring inside the inner circumferential wall, and the second groove, which is formed by the outer circumferential wall of the insulation ring, the portion of the upper surface of the locking ring outside the outer circumferential wall and the portion of the lower surface of the spacer ring outside the outer circumferential wall, plasma can be prevented from being deposited on the surface of the insulation ring, so it can avoid electrical connection between the spacer ring and the locking ring due to the deposition of metal onto the insulation ring, thereby allowing the spacer ring and the locking ring to be electrically insulated from each other throughout the process.

In the plasma processing apparatus according to an embodiment of the invention, by employing the above mechanical chuck according to an embodiment of the invention, the negative bias voltage formed on the upper surface of the workpiece can be increased without increasing RF power, thereby improving resputter rate.

Terms used herein are provided to explain embodiments, not limiting the invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the invention may suitably comprise, consist or consist essentially of the elements disclosed and may be practiced in the absence of an element not disclosed. According to at least one embodiment, it can be recognized by those skilled in the art that certain steps can be combined into a single step.

The terms and words used in the specification and claims should not be interpreted as being limited to typical meanings or dictionary definitions, but should be interpreted as having meanings and concepts relevant to the technical scope of the invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, it will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, having the other element intervening therebetween.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

It can be understood that the foregoing implementations are merely exemplary implementations used for describing the principle of embodiments of the invention, but embodiments of the invention are not limited thereto. Those of ordinary skill in the art may make various variations and improvements without departing from the spirit and essence of embodiments of the invention, and these variations and improvements shall fall into the protection scope of embodiments of the invention.

What is claimed is:

1. A mechanical chuck, comprising:
    a base configured to carry a workpiece to be processed; and
    a fixing assembly comprising a locking ring, an insulation ring, and a spacer ring sequentially stacked from bottom to top, a position of the insulation ring and a position of the spacer ring remaining fixed with respect to a position of the locking ring,
    wherein the locking ring is configured to press an edge region of the workpiece disposed on the base during a process to fix the workpiece onto the base,
    wherein an orthogonal projection of the spacer ring on an upper surface of the locking ring overlaps with the upper surface of the locking ring, and the upper surface of the locking ring is fully shielded by the spacer ring,
    wherein the insulation ring is configured to electrically insulate the spacer ring from the locking ring, and a voltage of the spacer ring remains floating,
    wherein an inner circumferential wall of the insulation ring, a portion of the upper surface of the locking ring inside the inner circumferential wall, and a portion of a lower surface of the spacer ring inside the inner circumferential wall together form a first groove, and
    wherein an outer circumferential wall of the insulation ring, a portion of the upper surface of the locking ring outside the outer circumferential wall, and a portion of the lower surface of the spacer ring outside the outer circumferential wall together form a second groove, to prevent plasma from being deposited onto a surface of the insulation ring.

2. The mechanical chuck according to claim 1, wherein the first groove has a depth-to-width ratio larger than 7:1, and the second groove has a depth-to-width ratio larger than 7:1.

3. The mechanical chuck according to claim 1, wherein the first groove and the second groove each have a width smaller than 3 mm.

4. The mechanical chuck according to claim 1, wherein the sum of heights of the insulation ring and the spacer ring in a direction perpendicular to the upper surface of the locking ring is no larger than 8 mm.

5. The mechanical chuck according to claim 1, wherein a material of the insulation ring includes ceramic or quartz.

6. The mechanical chuck according to claim 1, wherein the insulation ring is formed by plating an insulation material onto the upper surface of the locking ring.

7. The mechanical chuck according to claim 1, wherein a material of the spacer ring includes a metal or an insulation material.

8. The mechanical chuck according to claim 1, wherein the fixing assembly further includes an insulation screw used for fixing the locking ring, the insulation ring and the spacer ring together.

9. A plasma processing apparatus, comprising a reaction chamber, in which a mechanical chuck according to claim 1 is provided to carry a workpiece to be processed.

* * * * *